United States Patent [19]
Saxena et al.

[11] Patent Number: 5,533,035
[45] Date of Patent: Jul. 2, 1996

[54] ERROR DETECTION AND CORRECTION METHOD AND APPARATUS

[75] Inventors: Nirmal Saxena; Chih-Wei D. Chang, both of San Jose, Calif.

[73] Assignee: HaL Computer Systems, Inc., Campbell, Calif.

[21] Appl. No.: 465,367

[22] Filed: Jun. 5, 1995

Related U.S. Application Data

[63] Continuation-in-part of Ser. No. 78,012, Jun. 16, 1993, abandoned.

[51] Int. Cl.$^6$ ................................................ H03M 13/00
[52] U.S. Cl. .................... 371/38.1; 371/40.2; 371/37.1
[58] Field of Search .................... 371/37.1, 37.2, 371/37.4, 37.5, 37.7, 37.8, 38.1, 39.1, 40.1, 40.2, 40.3, 44

[56] References Cited

U.S. PATENT DOCUMENTS

| | | | |
|---|---|---|---|
| 3,656,107 | 4/1972 | Hsiao et al. | 371/37.2 |
| 3,685,014 | 8/1972 | Hsiao et al. | 371/37.2 |
| 3,714,629 | 1/1973 | Hong et al. | 371/37.8 |
| 4,139,148 | 2/1979 | Scheuneman et al. | 371/40.1 |
| 4,163,147 | 7/1979 | Scheuneman et al. | 371/37.2 |
| 4,637,021 | 1/1987 | Shenton | 371/37.1 |
| 5,051,999 | 9/1991 | Erhart et al. | 371/37.1 |

*Primary Examiner*—James P. Trammell
*Attorney, Agent, or Firm*—Phong K. Truong; Charles E. Gotlieb

[57] ABSTRACT

A method and apparatus are disclosed for detecting and correcting errors in the data stored within the entries of a memory table. Each time data is entered into the memory table, an error code generator generates a corresponding error code using the data. This error code is stored in the memory table along with the corresponding data. When an entry in the memory table is read out, an error detector receives the outputted data and its corresponding error code and processes the data and the error code to determine whether the outputted data contains any errors. If the outputted data contains any errors, the outputted data and error code are sent to an error correction unit. In response, the correction unit attempts to find single and double bit errors in the data by way of a compact and efficient computer program. If either a single or double bit error is found, the error correction unit corrects the error or errors to derive a set of corrected data. This corrected data is then written back to the proper entry within the memory table to correct the error or errors in the data. Data errors within the memory table are thus detected and corrected.

8 Claims, 11 Drawing Sheets

```
#include <stdio.h>
main()
{
 unsigned long register check,syndrome,syndrome1;
 unsigned long flag,loc,loc1;
 int i,j;
 unsigned long cw[4];

/* read in data bits */
 check=1;
while (check > 0) {
 for (i=0;i<4;i++)
 {
  printf("cw[%d]=",i);
   scanf("%1x",&cw[i]);
 }

/* calculate syndrome */
 check = 0;
 for (i=3;i>0;i--)
 {
  for (j=0;j<32;j++)
  {
   if ((check&0x4000)>0)
    check =(((check<<1)^20269) & 0x7fff);
   else
    check =(check<<1) & 0x7fff;
   check = ((cw[i]>>j)&0x1)^check;
  }
 } for (j=0;j<3;j++)
 {
  if ((check&0x4000)>0)
   check =(((check<<1)^20269) & 0x7fff);
  else
   check =(check<<1) & 0x7fff;
  check = ((cw[0]>>j)&0x1)^check;
  printf("check=%1x \n",check);
 } if (check>0)
 {
  printf("You Have an Error, Attempting to correct\n");
  syndrome = 1;
  flag = 0;
```

*FIG. 8a*

```
for (i=0; i<99; i++)
{
  if (check == syndrome)
  {
    flag = 1;
    break;
  }
  if ((syndrome&0x4000)>0)
    syndrome =(((syndrome<<1) ^20269) & 0x7fff);
  else
    syndrome =(syndrome<<1) & 0x7fff;
}
if (flag == 1)
{
  i = 98-i;
  printf("Single Correctable Error\n");
  loc = (unsigned long)i / 32;
  loc = 3-loc;
  cw[loc] = cw[loc] ^ (0x1 << ((unsigned long)i%32));
printf("Printing corrected codeword\n");
for (i=0;i<4;i++)
  {
    printf("cw[%d]=%1x\n",i,cw[i]);
  }
}
else
{
  printf("Trying for Double Bit Error Correction\n");
  syndrome = 1;
  flag = 0;
  for (i=0; i<98; i++)
  {
    if ((syndrome&0x4000)>0)
      syndrome1 =(((syndrome<<1) ^20269) & 0x7fff);
    else
      syndrome1 =(syndrome<<1) & 0x7fff;
    for (j=i+1; j<99; j++)
    {
      if (check == (syndrome^syndrome1))
      {
        flag = 1;
        break;
      }
```

*FIG. 8b*

```
         if ((syndrome1&0x4000)>0)
            syndrome1 =(((syndrome1<<1) ^20269) & 0x7fff);
         else
            syndrome1 =(syndrome1<<1) & 0x7fff;
      }
      if (flag==1)
         break;
      if ((syndrome&0x4000)>0)
         syndrome =(((syndrome<<1)^20269) & 0x7fff);
      else
         syndrome =(syndrome<<1) & 0x7fff;
   }
   if (flag == 1)
   {
      i = 98-i;
      j = 98-j;
      printf("Double Correctable Error\n");
      loc = (unsigned long)i / 32;
      loc = 3-loc;
      loc1 = (unsigned long) j / 32;
      loc1 = 3-loc1;
      cw[loc] = cw[loc] ^ (0x1 << ((unsigned long)i%32));
      cw[loc1] = cw[loc1] ^ (0x1 << ((unsigned long)j%32));
      printf("Printing corrected codeword\n");
      for (i=0;i<4;i++)
      {
         printf("cw[%d]=%1x\n",i,cw[i]);
      }
   }
   else
      printf("Error Uncorrectable\n");
   }
  }
 }
}
```

FIG. 8c

ERROR DETECTION AND CORRECTION METHOD AND APPARATUS

RELATED APPLICATIONS

This application is a continuation-in-part of U.S. patent application Ser. No. 08/078,012, filed on Jun. 16, 1993 abandoned.

FIELD OF THE INVENTION

This invention relates generally to memory coherence tables and more specifically to a method and apparatus for detecting and correcting transient errors occurring within a cache memory coherence table.

BACKGROUND OF THE INVENTION

A typical high performance computer system comprises a Central Processing Unit (CPU), a main memory, a cache memory, and a Memory Management Unit (MMU) for managing the flow of data between the memories themselves and between the memories and the CPU. In such a system, a two-tiered addressing scheme is commonly implemented using virtual and physical addresses. Virtual addresses correspond to addresses generated and used by the CPU in the course of executing a program, and physical addresses correspond to addresses at which actual memory locations can be found in main memory. One of the functions of the MMU is to translate virtual addresses into physical addresses to allow the CPU to get access to physical memory locations.

Another function of the MMU is to maintain consistency between data in the main memory and the copy of that data in the cache memory. Towards this end, the MMU maintains a Cache Physical Address Table (CPAT) which maps each entry in the cache memory to a corresponding physical location in main memory. For each entry in the cache table, there is a corresponding entry in the CPAT which contains the physical address in main memory of where the data corresponding to that cache entry is found. This physical address serves as the necessary link between the memories for maintaining data consistency. To elaborate, one policy commonly employed for maintaining data consistency is the "copy back" policy. This policy requires that, when a data entry is modified within the cache, the modified entry at some point must be copied back into the main memory. To copy the data back to main memory, a proper physical address must be provided so that the modified data is copied into the correct location. The entry in CPAT corresponding to the modified cache entry provides this physical address. Thus, the CPAT plays a vital role in maintaining data coherence.

Such a computer system functions well when the data stored within the CPAT are accurate, but if some of the physical addresses in CPAT are altered due to transient errors occurring within the CPAT, system integrity may be compromised. For example, suppose that a modified entry in the cache needs to be copied back to main memory but that the corresponding CPAT entry has been corrupted such that the CPAT entry contains an erroneous physical address. If the error is not detected and corrected, then the modified data will be copied back into the wrong location, which causes two errors in the system. First, the memory location to which the modified data should have been written will now contain outdated data. Second, the location to which the modified data is written will now contain incorrect data. These errors can seriously compromise the integrity of the system. To optimize the reliability of the computer system, a means is needed to detect and to correct the transient errors that may occur within a memory coherence table.

SUMMARY OF THE INVENTION

The present invention provides a method and apparatus which uses error correction codes to detect and to correct errors in a coherence table. The apparatus of the present invention preferably comprises an error code generator, an error detector, and an error correction unit. Each time a set of addresses is loaded into a block line of the coherence table, the code generator receives the addresses and generates a corresponding error correction code using the addresses. Preferably, the error code generated is a Hamming error correction code having a Hamming distance of six which may be used to detect three bits of error and to correct two bits of error in the addresses. Once generated, the error code is stored in the coherence table along with the corresponding addresses.

When information is read out of the table, both the addresses and their corresponding error code are outputted to the error detector. The detector processes the outputted addresses and the error code to determine if the outputted addresses contain any errors. Preferably, the error detector accomplishes this by using the outputted addresses and the error code to generate a syndrome code, and by determining whether the syndrome code has a non-zero value. If the syndrome code is non-zero, then the detector generates an error signal to indicate that the outputted addresses contain one or more errors.

If an error signal is generated by the error detector, the error signal triggers the operation of the error correction unit which, in the preferred embodiment, is implemented using computer code. The correction unit responds to the error signal by reading the outputted addresses and their corresponding error code. Thereafter, the correction unit modifies selected bits in the outputted addresses to produce a set of modified addresses. The modified addresses are processed with the error code to determine whether the modified addresses contain any errors. If so, the outputted addresses are again modified and the newly modified addresses are again processed with the error code to determine whether the newly modified addresses contain any errors. This procedure of modifying and processing the addresses and the error code continues until a correct set of modified addresses is found which contains no errors. This set of correct addresses is what the outputted addresses should have been had there been no transient errors within the table. The correction unit takes this set of correct addresses and writes them back into the proper block line of the coherence table. Thus, the corrupted addresses are detected and corrected.

BRIEF DESCRIPTION OF THE DRAWINGS

FIGS. 8a–8a provide the source code, written in the C programming language, of a computer program which may be utilized to implement the error correction unit 34 of the present invention.

DETAILED DESCRIPTION OF THE PREFERRED EMBODIMENT

In addition to the information disclosed herein, all of the material contained in U.S. patent application Ser. No. 08/078,012, filed on Jun. 16, 1993, is incorporated herein by this reference abandoned.

Figure 1:
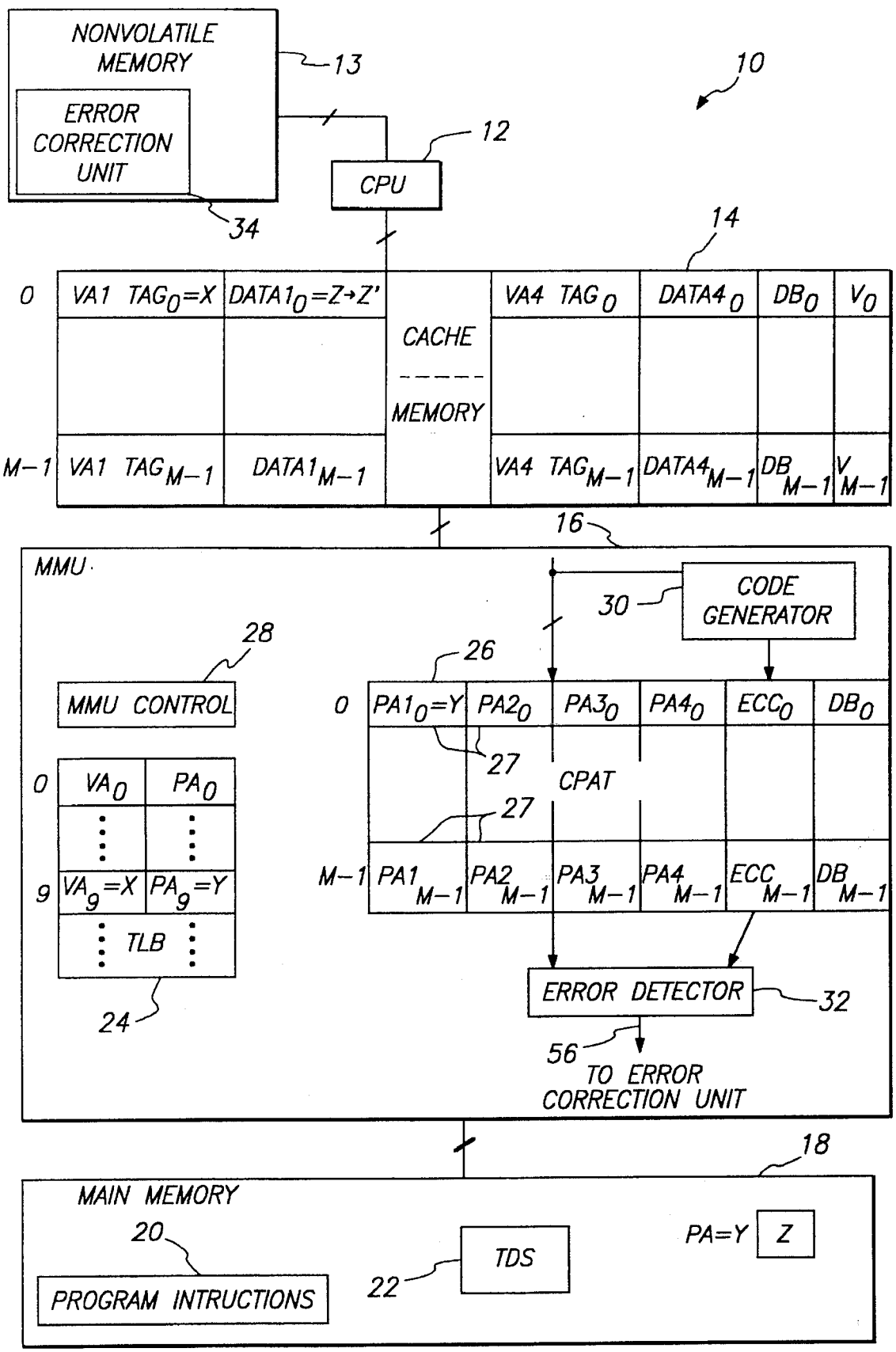
FIG. 1 is a block diagram of a computer system including an error code generator 30, an error detector 32, and an error correction unit 34 in accordance with the present invention.

With reference to FIG. 1, there is shown a system 10 which implements the present invention, the system 10 comprising a central processing unit (CPU) 12, a nonvolatile memory 13, a cache memory 14, a memory management unit (MMU) 16, and a main memory 18. In system 10, the CPU 12 (which may be a SPARC V9 microprocessor manufactured by Sun Microsystems, Inc. of Mountain View, Calif.) operates by ac accessing and executing the program instructions 20 stored within the main memory 18. In the process of executing these instructions 20, CPU 12 generates a plurality of "virtual addresses" which the CPU 12 uses and understands. These virtual addresses, however, have no direct correlation with the "physical addresses" located in the main memory 18; thus, a two-tiered addressing scheme is created including virtual addresses used by the CPU 12, and physical addresses used by the main memory 18. To map the virtual addresses to the physical addresses, and thereby, allow the CPU 12 to access physical locations within the main memory 18, there is maintained a set of Translation Data Structures (TDS) 22 within the main memory 18 which contain a complete set of virtual-to-physical address translations. The TDS 22 is used by the MMU 16 to provide the CPU 12 with the address translations that it needs. Once the CPU 12 receives the address translation from the MMU 16, it uses the translated address to access the physical location in main memory 18.

In executing programs, CPU 12 needs to access memory a great number of times to retrieve and to modify data. It is possible for CPU 12 to access main memory 18 each time it needs data, but such an implementation is relatively slow. To improve system performance, cache memory 14 is placed between CPU 12 and main memory 18 to store some of the most recently accessed data. If this data is needed again by CPU 12, ii may be retrieved from the faster cache memory 14 instead of from the main memory 18. One preferred characteristic of cache memory 14 is that its entries be "virtually tagged", that is, the data entries stored within cache memory 14 are preferably tagged by virtual addresses instead of physical addresses. This allows the address translation process to be bypassed. To illustrate, when CPU 12 wishes to access memory, it outputs a specific virtual address. If the entries in cache memory 14 are tagged using virtual addresses, and if the specific virtual address is currently stored within the cache 14, then the desired data is retrieved from the cache 14 without having to translate the virtual address into a physical address. Thus, virtually tagging the cache entries saves on translation time which, in turn, improves system efficiency.

As mentioned above, one of the functions of the MMU 16 is to translate addresses for CPU 12 by accessing and consulting the TDS 22 in main memory 18. To accelerate the translation process, MMU 16 maintains a Table Lookaside Buffer (TLB) 24 which acts as a cache memory to hold the most recently requested address translations. If a requested translation is stored within TLB 24, that translation is retrieved directly from TLB 24, thereby obviating the need to access the slower main memory.

Another function of MMU 16 is to maintain data consistency between the main memory 18 and the cache 14. Towards this end, MMU 16 maintains a Cache Physical Address Table (CPAT) 26 which comprises a plurality of entries 27, each entry 27 storing a physical address. Recall that the entries in cache 14 are tagged using virtual addresses. This means that the cache entries, without more, have no link to the physical addresses in main memory 18 at which the identical data can be found. The CPAT 26 provides this link by storing within its entries the physical addresses in main memory at which each of the cache entries can be found. Preferably, the number of entries 27 in the CPAT 26 is the same as the number of cache entries in the cache 14 so that there is a one-to-one correspondence between the respective entries.

To elaborate on this point, in the system of FIG. 1, the cache memory 14 is shown as having M block lines (or sets), each block line containing four cache line entries. A cache entry is composed of a virtual address tag and an associated set of data; thus, in cache 14, VA1 $tag_0$ and $Data1_0$ constitute one cache entry, and VA4 $tag_0$ and $Data4_0$ constitute another cache entry. With regard to the labeling of these entries, the numeral following the VA's and the Data's specifies the ordering of the cache entry, while the numeral written in subscript specifies the number of the block line. Thus, VA4 $tag_0$ is the virtual address tag for the fourth cache entry in block line 0. Since the cache 14 is set up in this manner, the CPAT 26 is preferably similarly arranged. That is, CPAT 26 preferably comprises M block lines with each block line having four entries 27. Each of the entries 27 contains a physical address in main memory at which the data in a corresponding cache entry can be found. Accordingly, $PA1_0$ in CPAT 26 preferably contains the physical address in main memory at which the data in cache entry VA1 $tag_0$, $Data1_0$ can be found, $PA4_0$ contains the physical address in main memory at which the data in cache entry VA4 $tag_0$, $Data4_0$ can be found, and so on. In this manner, each entry in cache 14 is directly linked to its corresponding physical address in main memory.

To illustrate how CPAT 26 is used to ensure data consistency (or coherence), suppose that CPU 12 wishes to access data at a virtual address X. Suppose further that this data is not currently stored within the cache 14. Consequently, virtual address X is passed on to the MMU 16 for further processing. The MMU 16 receives virtual address X and translates it to a physical address using TLB 24. As shown in FIG. 1, entry line 9 of TLB 24 contains virtual address X and its corresponding physical address translation Y. This entry is used to translate virtual address X into physical address Y. Thereafter, physical address Y is used to access location Y in main memory to retrieve the data Z stored therein. After the data Z is retrieved from main memory 18, the proper entries in CPAT 16 and cache 14 are loaded with the appropriate information. Specifically, physical address Y is loaded into entry $PA1_0$ of CPAT 26, virtual address X is loaded into VA1 $tag_0$ of cache 14, and data Z is loaded into $Data1_0$ of cache 14.

Suppose now that the CPU 12 modifies the data in $Data1_0$ of cache 14 from Z to Z'. This causes the data Z' in the cache 14 and the data Z in main memory 18 to now be inconsistent. Since CPU 12 is aware that it modified the cache entry, and hence, has caused a resultant data inconsistency, it sets the dirty bit $DB_0$ in block line 0 of CPAT 26 to "1" and the dirty bit $DB_0$ in block line 0 of cache 14 to "1". In response to the setting of these dirty bits, the MMU control 28 takes the data Z' in $Data1_0$ and writes it back to the proper location in main memory 18 to make the two memories 14, 18 consistent. The physical address used for this write-back operation is the address stored in $PA1_0$ of CPAT 26, namely, physical address Y. From this example, it is clear that CPAT 26 plays a vital role in maintaining data coherence because, without CPAT 26, the MMU control 28 would not have known to which physical address to write the modified data Z'. Since the information stored within CPAT 26 is so important for data coherency purposes, any data corruption occurring within CPAT 26 needs to be detected and corrected if system integrity is to be preserved.

Towards this end, system 10 further comprises an apparatus for detecting and correcting errors within CPAT 24, the apparatus comprising an error code generator 30, an error detector 32, and an error correction unit 34 stored within nonvolatile memory 13. Each component will be described separately.

When data is accessed from main memory 18 and is loaded into the cache memory 14, the physical address associated with that data is loaded into the CPAT 26. Since the CPAT 26 is loaded a block line at a time, and since each block line of CPAT 26 contains four physical addresses, four addresses are loaded each time information is loaded into CPAT. The loading of addresses into CPAT 26 is controlled by MMU control 28, which is a component of conventional design. For example, a similar MMU control is incorporated into the Motorola MC88200 MMU chip (which is manufactured by Motorola, Inc. of Schaumburg, Ill.). Hence, MMU control 28 will not be described in detail herein.

Each time new addresses are loaded into CPAT 26, error code generator 30 receives the addresses and generates an error correction code (ECC) using the addresses. Preferably, the error code is a unique representation of the addresses which may be processed with the addresses at a later time to detect and to correct errors in the addresses. In the preferred embodiment, the error correction code generated by generator 30 is a Hamming error correction code. Hamming coding theory is known and is described in Error Control Coding: Fundamentals and Applications by S. Lin and D. J. Costello, Prentice-Hall, 1983, pages 51–124, which is incorporated herein by this reference. Preferably, the Hamming code is generated using the: following generating polynomial:

$$(1+x)(1+x+x^7)(1+x^3+x^7)=1+x^2+x^3+x^5+x^8+x^9+x^{10}+x^{11}+x^{14}+x^{15}$$

An error correction code generated using this polynomial has a Hamming distance of six. An ECC having such a Hamming distance may be used to detect up to three bits of error and to correct up to two bits of error in the CPAT 26 addresses. In the preferred embodiment, each physical address stored within CPAT 26 contains twenty-one bits. Because each block line contains four addresses, each block line has eighty-four address bits. Under Hamming code theory, to generate an error correction code having a Hamming distance of six for this number of bits, a fifteen bit ECC will need to be used. Denoting the address bits as A0–A83, the fifteen bits $ECC_0$–$ECC_{14}$ of the error correction code ECC are generated using the following logic equations:

$ECC_0 = A0\textasciicircum A1\textasciicircum A2\textasciicircum A3\textasciicircum A6\textasciicircum A7\textasciicircum A10$
$\textasciicircum A13\textasciicircum A14\textasciicircum A15\textasciicircum A16\textasciicircum A17\textasciicircum A18\textasciicircum A21\textasciicircum A22$
$\textasciicircum A24\textasciicircum A26\textasciicircum A28\textasciicircum A30\textasciicircum A34\textasciicircum A37\textasciicircum A39\textasciicircum A44$
$\textasciicircum A45\textasciicircum A46\textasciicircum A47\textasciicircum A49\textasciicircum A50\textasciicircum A52\textasciicircum A54\textasciicircum A56$
$\textasciicircum A60\textasciicircum A61\textasciicircum A70\textasciicircum A71\textasciicircum A75\textasciicircum A78\textasciicircum A82$;

$ECC_1 = A1\textasciicircum A2\textasciicircum A3\textasciicircum A4\textasciicircum A7\textasciicircum A8\textasciicircum A11$
$\textasciicircum A14\textasciicircum A15\textasciicircum A16\textasciicircum A17\textasciicircum A18\textasciicircum A19\textasciicircum A22\textasciicircum A23$
$\textasciicircum A24\textasciicircum A26\textasciicircum A28\textasciicircum A30\textasciicircum A34\textasciicircum A37\textasciicircum A39\textasciicircum A44$
$\textasciicircum A45\textasciicircum A46\textasciicircum A47\textasciicircum A49\textasciicircum A50\textasciicircum A52\textasciicircum A54\textasciicircum A56$
$\textasciicircum A60\textasciicircum A61\textasciicircum A70\textasciicircum A71\textasciicircum A75\textasciicircum A78\textasciicircum A82$;

$ECC_2 = A0\textasciicircum A1\textasciicircum A4\textasciicircum A5\textasciicircum A6\textasciicircum A7\textasciicircum A8$
$\textasciicircum A9\textasciicircum A10\textasciicircum A12\textasciicircum A13\textasciicircum A14\textasciicircum A19\textasciicircum A20\textasciicircum A21$
$\textasciicircum A22\textasciicircum A23\textasciicircum A32\textasciicircum A34\textasciicircum A36\textasciicircum A37\textasciicircum A41\textasciicircum A44$
$\textasciicircum A45\textasciicircum A48\textasciicircum A50\textasciicircum A51\textasciicircum A58\textasciicircum A60\textasciicircum A61\textasciicircum A62$
$\textasciicircum A63\textasciicircum A70\textasciicircum A71\textasciicircum A72\textasciicircum A73\textasciicircum A75\textasciicircum A77\textasciicircum A78$
$\textasciicircum A80\textasciicircum A82$;

$ECC_3 = A0\textasciicircum A3\textasciicircum A5\textasciicircum A8\textasciicircum A9\textasciicircum A11\textasciicircum A16$
$\textasciicircum A17\textasciicircum A18\textasciicircum A20\textasciicircum A23\textasciicircum A26\textasciicircum A28\textasciicircum A30\textasciicircum A33$
$\textasciicircum A34\textasciicircum A35\textasciicircum A38\textasciicircum A39\textasciicircum A42\textasciicircum A44\textasciicircum A47\textasciicircum A50$
$\textasciicircum A51\textasciicircum A54\textasciicircum A56\textasciicircum A59\textasciicircum A60\textasciicircum A62\textasciicircum A63\textasciicircum A64$
$\textasciicircum A70\textasciicircum A72\textasciicircum A73\textasciicircum A74\textasciicircum A75\textasciicircum A76\textasciicircum A79\textasciicircum A81$
$\textasciicircum A82\textasciicircum A83$;

$ECC_4 = A1\textasciicircum A4\textasciicircum A6\textasciicircum A9\textasciicircum A10\textasciicircum A12\textasciicircum A17$
$\textasciicircum A18\textasciicircum A19\textasciicircum A21\textasciicircum A24\textasciicircum A27\textasciicircum A29\textasciicircum A31\textasciicircum A34$
$\textasciicircum A35\textasciicircum A36\textasciicircum A39\textasciicircum A40\textasciicircum A43\textasciicircum A45\textasciicircum A48\textasciicircum A51$
$\textasciicircum A52\textasciicircum A55\textasciicircum A57\textasciicircum A60\textasciicircum A61\textasciicircum A63\textasciicircum A64\textasciicircum A65$
$\textasciicircum A71\textasciicircum A73\textasciicircum A74\textasciicircum A75\textasciicircum A76\textasciicircum A77\textasciicircum A80\textasciicircum A82$
$\textasciicircum A83$;

$ECC_5 = A0\textasciicircum A1\textasciicircum A3\textasciicircum A5\textasciicircum A6\textasciicircum A11\textasciicircum A14$
$\textasciicircum A15\textasciicircum A16\textasciicircum A17\textasciicircum A19\textasciicircum A20\textasciicircum A21\textasciicircum A24\textasciicircum A25$
$\textasciicircum A26\textasciicircum A32\textasciicircum A34\textasciicircum A35\textasciicircum A36\textasciicircum A39\textasciicircum A40\textasciicircum A41$
$\textasciicircum A45\textasciicircum A47\textasciicircum A50\textasciicircum A53\textasciicircum A54\textasciicircum A58\textasciicircum A60\textasciicircum A62$
$\textasciicircum A64\textasciicircum A65\textasciicircum A66\textasciicircum A70\textasciicircum A71\textasciicircum A72\textasciicircum A74\textasciicircum A76$
$\textasciicircum A77\textasciicircum A81\textasciicircum A82\textasciicircum A83$;

$ECC_6 = A1\textasciicircum A2\textasciicircum A4\textasciicircum A6\textasciicircum A7\textasciicircum A12\textasciicircum A15$
$\textasciicircum A16\textasciicircum A17\textasciicircum A18\textasciicircum A20\textasciicircum A21\textasciicircum A22\textasciicircum A25\textasciicircum A26$
$\textasciicircum A27\textasciicircum A33\textasciicircum A35\textasciicircum A36\textasciicircum A37\textasciicircum A40\textasciicircum A41\textasciicircum A42$
$\textasciicircum A46\textasciicircum A48\textasciicircum A51\textasciicircum A54\textasciicircum A55\textasciicircum A59\textasciicircum A61\textasciicircum A63$
$\textasciicircum A65\textasciicircum A66\textasciicircum A67\textasciicircum A71\textasciicircum A72\textasciicircum A73\textasciicircum A75\textasciicircum A77$
$\textasciicircum A78\textasciicircum A82\textasciicircum A83$;

$ECC_7 = A2\textasciicircum A3\textasciicircum A5\textasciicircum A7\textasciicircum A8\textasciicircum A13\textasciicircum A16$
$\textasciicircum A17\textasciicircum A18\textasciicircum A19\textasciicircum A21\textasciicircum A22\textasciicircum A23\textasciicircum A26\textasciicircum A27$
$\textasciicircum A28\textasciicircum A34\textasciicircum A36\textasciicircum A37\textasciicircum A38\textasciicircum A41\textasciicircum A42\textasciicircum A43$
$\textasciicircum A47\textasciicircum A49\textasciicircum A52\textasciicircum A55\textasciicircum A56\textasciicircum A60\textasciicircum A62\textasciicircum A64$
$\textasciicircum A66\textasciicircum A67\textasciicircum A68\textasciicircum A72\textasciicircum A73\textasciicircum A74\textasciicircum A76\textasciicircum A78$
$\textasciicircum A79\textasciicircum A83$;

$ECC_8 = A0\textasciicircum A1\textasciicircum A2\textasciicircum A4\textasciicircum A7\textasciicircum A8\textasciicircum A9$
$\textasciicircum A10\textasciicircum A13\textasciicircum A15\textasciicircum A16\textasciicircum A19\textasciicircum A20\textasciicircum A21\textasciicircum A23$
$\textasciicircum A26\textasciicircum A27\textasciicircum A29\textasciicircum A30\textasciicircum A34\textasciicircum A35\textasciicircum A38\textasciicircum A42$
$\textasciicircum A43\textasciicircum A45\textasciicircum A46\textasciicircum A47\textasciicircum A48\textasciicircum A49\textasciicircum A52\textasciicircum A53$
$\textasciicircum A54\textasciicircum A57\textasciicircum A60\textasciicircum A63\textasciicircum A65\textasciicircum A67\textasciicircum A68\textasciicircum A69$
$\textasciicircum A70\textasciicircum A71\textasciicircum A73\textasciicircum A74\textasciicircum A77\textasciicircum A78\textasciicircum A79\textasciicircum A80$
$\textasciicircum A82$;

$ECC_9 = A0\textasciicircum A5\textasciicircum A6\textasciicircum A7\textasciicircum A8\textasciicircum A9\textasciicircum A11$
$\textasciicircum A13\textasciicircum A15\textasciicircum A18\textasciicircum A20\textasciicircum A26\textasciicircum A27\textasciicircum A31\textasciicircum A34$
$\textasciicircum A35\textasciicircum A36\textasciicircum A37\textasciicircum A43\textasciicircum A45\textasciicircum A48\textasciicircum A52\textasciicircum A53$
$\textasciicircum A55\textasciicircum A56\textasciicircum A58\textasciicircum A60\textasciicircum A64\textasciicircum A66\textasciicircum A68\textasciicircum A69$
$\textasciicircum A72\textasciicircum A74\textasciicircum A79\textasciicircum A80\textasciicircum A81\textasciicircum A82\textasciicircum A83$;

$ECC_{10} = A0\textasciicircum A2\textasciicircum A3\textasciicircum A8\textasciicircum A9\textasciicircum A12\textasciicircum A13$
$\textasciicircum A15\textasciicircum A17\textasciicircum A18\textasciicircum A19\textasciicircum A22\textasciicircum A24\textasciicircum A26\textasciicircum A27$
$\textasciicircum A30\textasciicircum A32\textasciicircum A34\textasciicircum A35\textasciicircum A36\textasciicircum A38\textasciicircum A39\textasciicircum A45$
$\textasciicircum A47\textasciicircum A50\textasciicircum A52\textasciicircum A53\textasciicircum A57\textasciicircum A59\textasciicircum A60\textasciicircum A65$
$\textasciicircum A67\textasciicircum A69\textasciicircum A71\textasciicircum A73\textasciicircum A78\textasciicircum A80\textasciicircum A81\textasciicircum A83$;

$ECC_{11} = A0\textasciicircum A2\textasciicircum A4\textasciicircum A6\textasciicircum A7\textasciicircum A9\textasciicircum A15$
$\textasciicircum A17\textasciicircum A19\textasciicircum A20\textasciicircum A21\textasciicircum A22\textasciicircum A23\textasciicircum A24\textasciicircum A25$
$\textasciicircum A26\textasciicircum A27\textasciicircum A30\textasciicircum A31\textasciicircum A33\textasciicircum A34\textasciicircum A35\textasciicircum A36$
$\textasciicircum A40\textasciicircum A44\textasciicircum A45\textasciicircum A47\textasciicircum A48\textasciicircum A49\textasciicircum A50\textasciicircum A51$
$\textasciicircum A52\textasciicircum A53\textasciicircum A56\textasciicircum A58\textasciicircum A66\textasciicircum A68\textasciicircum A71\textasciicircum A72$ -continued

^A74^A75^A78^A79^A81;

$ECC_{12}$ = A1^A3^A5^A7^A8^A10^A16
^A18^A20^A21^A22^A23^A24^A25^A26
^A27^A28^A31^A32^A34^A35^A36^A37
^A41^A45^A46^A48^A49^A50^A51^A52
^A53^A54^A57^A59^A67^A69^A72^A73
^A75^A76^A79^A80^A82;

$ECC_{13}$ = A2^A4^A6^A8^A9^A11^A17
^A19^A21^A22^A23^A24^A25^A26^A27
^A28^A29^A32^A33^A35^A36^A37^A38
^A42^A46^A47^A49^A50^A51^A52^A53
^A54^A55^A58^A60^A68^A70^A73^A74
^A76^A77^A80^A81^A83;

$ECC_{14}$ = A0^A1^A2^A5^A6^A9^A12
^A13^A14^A15^A16^A17^A20^A21^A23
^A25^A27^A29^A33^A36^A38^A43^A44
^A45^A46^A48^A49^A51^A53^A55^A59
^A60^A69^A70^A74^A77^A81, where ^ denotes an XOR operation.

From a review of the above equations, it can be seen that each error code bit is generated by simply XORing a plurality of address bits together; thus, to generate each code bit, it is possible to simply use an XOR gate having the proper number of inputs. For example, code bit $ECC_0$ can be generated using a 38-input XOR gate. Such an implementation in not practicable, however, because an XOR gate having such a large number of inputs would be too complex and costly. Instead, each error code bit is preferably generated using the layered XOR gate structure.

Figure 2:
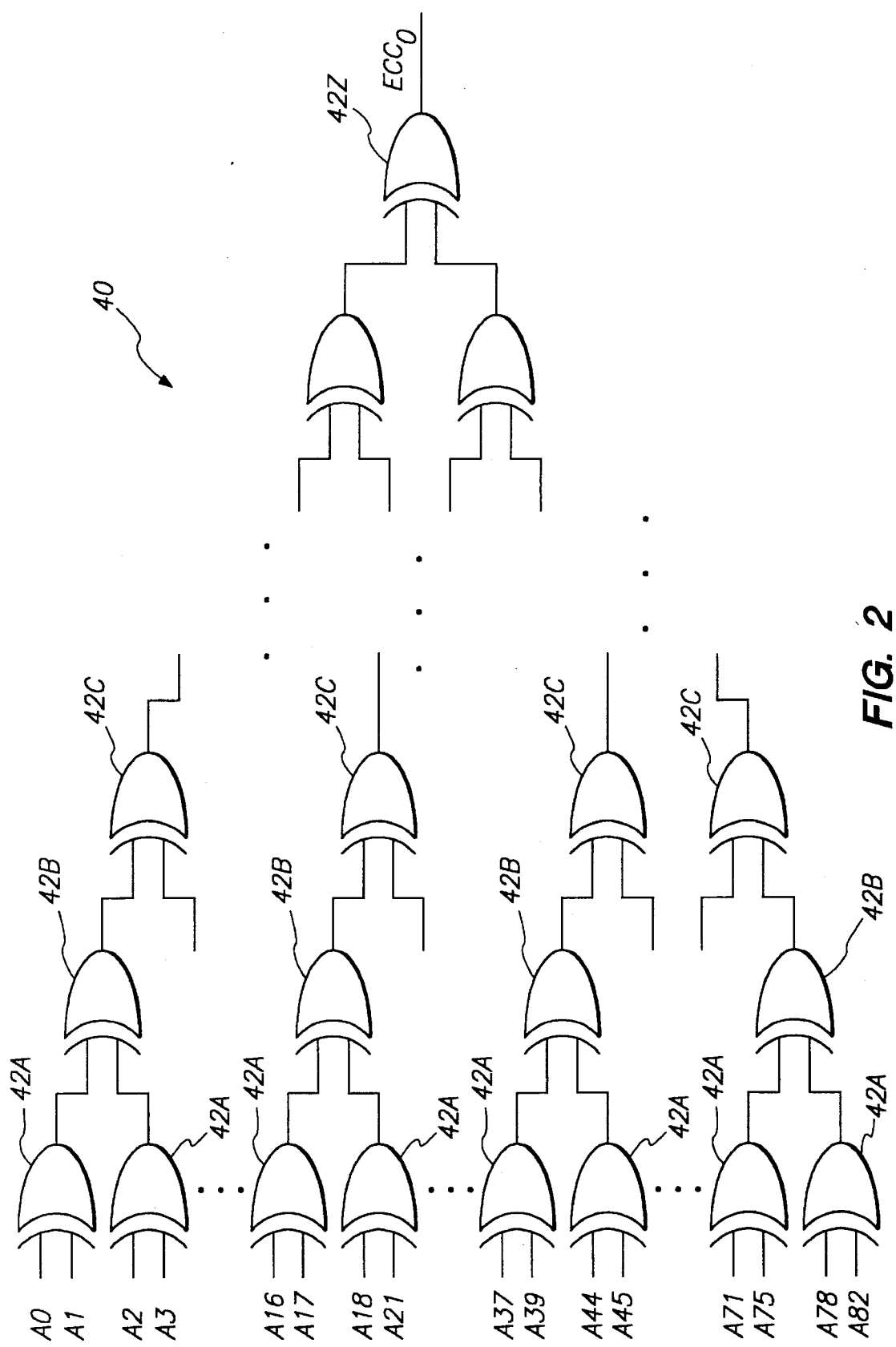
FIG. 2 is a partial circuit diagram of a multi-layered XOR gate circuit which is used to generate one of the error correction code bits $ECC_0$.

As an illustration, the error code bit $ECC_0$ is preferably generated using the layered XOR circuit 40 shown in FIG. 2. From the logic equation for $ECC_0$ given above, it is known that thirty-eight address bits must be XORed together to generate $ECC_0$. To accommodate all of these inputs, nineteen two-input XOR gates 42A are provided at the lowest level of the circuit 40. As shown in FIG. 2, each of the thirty-eight address bits is inputted to one of the XOR gates 42A. Each gate 42A in the lowest layer performs an XOR operation on its two input bits and provides an output. Each of the XOR gates 42B in the next layer takes two of these outputs and XORs them together to provide a second layer output. Each of the XOR gates 42C in the next layer takes two of the second layer outputs and XORs them together to provide a third layer output. This process continues until the highest layer is reached. Since two-input gates are used, each successive layer has half the number of gates as the previous layer. The number of gates diminishes with each successive layer until, at the highest layer, there is only one gate 42Z. The output of this gate 42Z is the error code bit $ECC_0$. $ECC_0$ is thus generated. Since the equations for the other error code bits $ECC_1$–$ECC_{14}$ are quite similar to that for $ECC_0$, circuits similar to circuit 40 may be used to generate the remaining error correction code bits. Code generator 30 thus comprises fifteen multi-layered XOR gate circuits, each circuit generating one of the fifteen bits of the error correction code ECC. After ECC is generated, it is loaded into a block line of the CPAT 26 along with the addresses used to generate the code. Thus, each block line of CPAT 26 comprises four physical addresses and an ECC associated with those addresses.

When it comes time to access and use the information stored within CPAT 26, a block line of the CPAT 26 is outputted to the error detector 32. Specifically, detector 32 receives four physical addresses and a corresponding ECC from the CPAT 26, and processes these addresses and ECC to determine whether the addresses contain any errors. Stated in another way, detector 32 determines, based on the outputted addresses and ECC, whether the outputted addresses are identical to the addresses used originally to generate the ECC. If not, then it can be concluded that the addresses were corrupted while they were stored within the CPAT 26. Preferably, detector 32 makes this error determination by using a two step process. First, detector 32 uses the outputted addresses and ECC to generate a fifteen bit syndrome code $SYN_0$–$SYN_{14}$. Then, detector 32 determines whether the syndrome code SYN has a non-zero value. If the syndrome code is non-zero, then the outputted addresses contain errors.

Denoting the outputted addresses as A0–A83, the fifteen syndrome bits $SYN_0$–$SYN_{14}$ are generated using the following logic equations:

$SYN_0$ = $ECC_0$^A0^A1^A2^A3^A6^A7^A10
^A13^A14^A15^A16^A17^A18^A21^A22
^A24^A26^A28^A30^A34^A37^A39^A44
^A45^A46^A47^A49^A50^A52^A54^A56
^A60^A61^A70^A71^A75^A78^A82;

$SYN_1$ = $ECC_1$^A1^A2^A3^A4^A7^A8^A11
^A14^A15^A16^A17^A18^A19^A22^A23
^A25^A26^A29^A31^A35^A38^A40^A45
^A46^A47^A48^A50^A51^A53^A55^A57
^A61^A62^A71^A72^A76^A79^A83;

$SYN_2$ = $ECC_2$^A0^A1^A4^A5^A6^A7^A8
^A9^A10^A12^A13^A14^A19^A20^A21
^A22^A23^A32^A34^A36^A37^A41^A44
^A45^A48^A50^A51^A58^A60^A61^A62
^A63^A70^A71^A72^A73^A75^A77^A78
^A80^A82;

$SYN_3$ = $ECC_3$^A0^A3^A5^A8^A9^A11^A16
^A17^A18^A20^A23^A26^A28^A30^A33
^A34^A35^A38^A39^A42^A44^A47^A50
^A51^A54^A56^A59^A60^A62^A63^A64
^A70^A72^A73^A74^A75^A76^A79^A81
^A82^A83;

$SYN_4$ = $ECC_4$^A1^A4^A6^A9^A10^A12^A17
^A18^A19^A21^A24^A27^A29^A31^A34
^A35^A36^A39^A40^A43^A45^A48^A51
^A52^A55^A57^A60^A61^A63^A64^A65
^A71^A73^A74^A75^A76^A77^A80^A82
^A83;

$SYN_5$ = $ECC_5$^A0^A1^A3^A5^A6^A11^A14
^A15^A16^A17^A19^A20^A21^A24^A25
^A26^A32^A34^A35^A36^A39^A40^A41
^A45^A47^A50^A53^A54^A58^A60^A62
^A64^A65^A66^A70^A71^A72^A74^A76
^A77^A81^A82^A83;

$SYN_6$ = $ECC_6$^A1^A2^A4^A6^A7^A12^A15
^A16^A17^A18^A20^A21^A22^A25^A26
^A27^A33^A35^A36^A37^A40^A41^A42
^A46^A48^A51^A54^A55^A59^A61^A63
^A65^A66^A67^A71^A72^A73^A75^A77
^A78^A82^A83;

$SYN_7$ = $ECC_7$^A2^A3^A5^A7^A8^A13^A16
^A17^A18^A19^A21^A22^A23^A26^A27
^A28^A34^A36^A37^A38^A41^A42^A43
^A47^A49^A52^A55^A56^A60^A62^A64
^A66^A67^A68^A72^A73^A74^A76^A78
^A79^A83;

$SYN_8$ = $ECC_8$^A0^A1^A2^A4^A7^A8^A9
^A10^A13^A15^A16^A19^A20^A21^A23
^A26^A27^A29^A30^A34^A35^A38^A42
^A43^A45^A46^A47^A48^A49^A52^A53
^A54^A57^A60^A63^A65^A67^A68^A69
^A70^A71^A73^A74^A77^A78^A79^A80
^A82;

$SYN_9$ = $ECC_9$^A0^A5^A6^A7^A8^A9^A11
^A13^A15^A18^A20^A26^A27^A31^A34

-continued $^\wedge A35^\wedge A36^\wedge A37^\wedge A43^\wedge A45^\wedge A48^\wedge A52^\wedge A53$
$^\wedge A55^\wedge A56^\wedge A58^\wedge A60^\wedge A64^\wedge A66^\wedge A68^\wedge A69$
$^\wedge A72^\wedge A74^\wedge A79^\wedge A80^\wedge A81^\wedge A82^\wedge A83;$ $SYN_{10} = ECC_{10}{}^\wedge A0^\wedge A2^\wedge A3^\wedge A8^\wedge A9^\wedge A12^\wedge A13$
$^\wedge A15^\wedge A17^\wedge A18^\wedge A19^\wedge A22^\wedge A24^\wedge A26^\wedge A27$
$^\wedge A30^\wedge A32^\wedge A34^\wedge A35^\wedge A36^\wedge A38^\wedge A39^\wedge A45$
$^\wedge A47^\wedge A50^\wedge A52^\wedge A53^\wedge A57^\wedge A59^\wedge A60^\wedge A65$
$^\wedge A67^\wedge A69^\wedge A71^\wedge A73^\wedge A78^\wedge A80^\wedge A81^\wedge A83;$ $SYN_{11} = ECC_{11}{}^\wedge A0^\wedge A2^\wedge A4^\wedge A6^\wedge A7^\wedge A9^\wedge A15$
$^\wedge A17^\wedge A19^\wedge A20^\wedge A21^\wedge A22^\wedge A23^\wedge A24^\wedge A25$
$^\wedge A26^\wedge A27^\wedge A30^\wedge A31^\wedge A33^\wedge A34^\wedge A35^\wedge A36$
$^\wedge A40^\wedge A44^\wedge A45^\wedge A47^\wedge A48^\wedge A49^\wedge A50^\wedge A51$
$^\wedge A52^\wedge A53^\wedge A56^\wedge A58^\wedge A66^\wedge A68^\wedge A71^\wedge A72$
$^\wedge A74^\wedge A75^\wedge A78^\wedge A79^\wedge A81;$ $SYN_{12} = ECC_{12}{}^\wedge A1^\wedge A3^\wedge A5^\wedge A7^\wedge A8^\wedge A10^\wedge A16$
$^\wedge A18^\wedge A20^\wedge A21^\wedge A22^\wedge A23^\wedge A24^\wedge A25^\wedge A26$
$^\wedge A27^\wedge A28^\wedge A31^\wedge A32^\wedge A34^\wedge A35^\wedge A36^\wedge A37$
$^\wedge A41^\wedge A45^\wedge A46^\wedge A48^\wedge A49^\wedge A50^\wedge A51^\wedge A52$
$^\wedge A53^\wedge A54^\wedge A57^\wedge A59^\wedge A67^\wedge A69^\wedge A72^\wedge A73$
$^\wedge A75^\wedge A76^\wedge A79^\wedge A80^\wedge A82;$ $SYN_{13} = ECC_{13}{}^\wedge A2^\wedge A4^\wedge A6^\wedge A8^\wedge A9^\wedge A11^\wedge A17$
$^\wedge A19^\wedge A21^\wedge A22^\wedge A23^\wedge A24^\wedge A25^\wedge A26^\wedge A27$
$^\wedge A28^\wedge A29^\wedge A32^\wedge A33^\wedge A35^\wedge A36^\wedge A37^\wedge A38$
$^\wedge A42^\wedge A46^\wedge A47^\wedge A49^\wedge A50^\wedge A51^\wedge A52^\wedge A53$
$^\wedge A54^\wedge A55^\wedge A58^\wedge A60^\wedge A68^\wedge A70^\wedge A73^\wedge A74$
$^\wedge A76^\wedge A77^\wedge A80^\wedge A81^\wedge A83;$ $SYN_{14} = ECC_{14}{}^\wedge A0^\wedge A1^\wedge A2^\wedge A5^\wedge A6^\wedge A9^\wedge A12$
$^\wedge A13^\wedge A14^\wedge A15^\wedge A16^\wedge A17^\wedge A20^\wedge A21^\wedge A23$
$^\wedge A25^\wedge A27^\wedge A29^\wedge A33^\wedge A36^\wedge A38^\wedge A43^\wedge A44$
$^\wedge A45^\wedge A46^\wedge A48^\wedge A49^\wedge A51^\wedge A53^\wedge A55^\wedge A59$
$^\wedge A60^\wedge A69^\wedge A70^\wedge A74^\wedge A77^\wedge A81,$ where ^ signifies an XOR operation.

Figure 3:
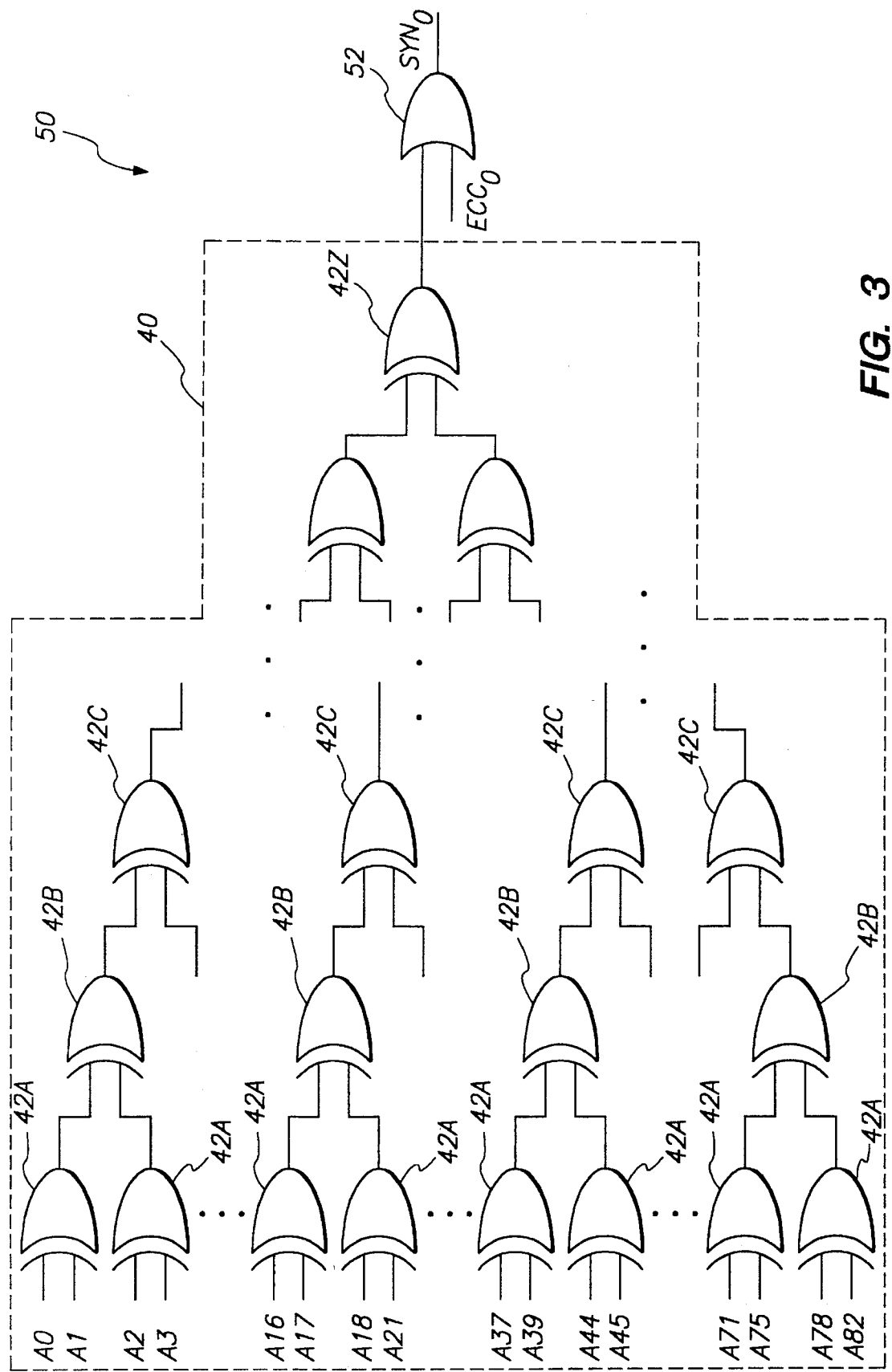
FIG. 3 is a partial circuit diagram of a multi-layered XOR gate circuit which is used to generate one of the syndrome code bits $SYN_0$.

A comparison of these equations with those for generating the ECC code bits reveals an interesting point, which is that the equations are substantially the same. For example, the equation for $SYN_0$ is identical to the equation for $ECC_0$ except that $SYN_0$ requires $ECC_0$ as an additional input. All of the other inputs are the same. Likewise, the equation for $SYN_1$ is identical to the equation for $ECC_1$ except that $SYN_1$ requires $ECC_1$ as an additional input. The same is true for all of the other syndrome bits. The practical significance of this is that error detector 32 may reuse the circuitry in code generator 30 to generate the syndrome bits. The only modification necessary is the addition of one XOR gate. To illustrate, a circuit for generating syndrome bit $SYN_0$ is shown in FIG. 3. Note that the only difference between circuit 50 of FIG. 3 and circuit 40 of FIG. 2 is the additional XOR gate 52 which has $ECC_0$ as one of its inputs. All of the other components are the same. Thus, the circuitry used for generating $ECC_0$ may be reused to generate the syndrome bit $SYN_0$. The other syndrome bits $SYN_1$–$SYN_{14}$ may be generated in a similar fashion by reusing the other circuitry of code generator 30 and by modifying the circuitry to include one additional XOR gate. Thus, error detector 32 preferably comprises fifteen circuits similar to circuit 50, each circuit generating one of the fifteen syndrome bits $SYN_1$–$SYN_{14}$. The use of identical circuit components in both the code generator 30 and the error detector 32 results in great savings in terms of the hardware needed to implement the present invention.

Figure 4:
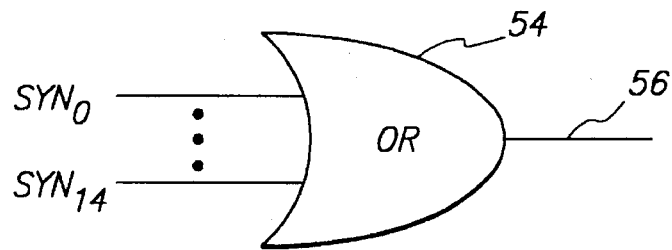
FIG. 4 is a circuit diagram of a determining circuit which is used to determine whether all of the syndrome code bits are zero.

After the syndrome code bits $SYN_0$–$SYN_{14}$ are generated, it needs to be determined whether all of the syndrome bits are zero. This may be carried out by sending the syndrome bits to a determining circuit such as that shown in FIG. 4. The determining circuit preferably takes the form of a fifteen-input OR gate 54 which receives the fifteen syndrome bits $SYN_0$–$SYN_{14}$ as inputs. If all of the syndrome bits $SYN_0$–$SYN_{14}$ are zero, then the output 56 of OR gate 54 will be zero, thereby, indicating that no error has occurred. If any syndrome bit is a one, then OR gate 54 will output a one to indicate that the addresses contain errors. Thus, the output 56 of OR gate 54 serves as the output of error detector 32 to output an error signal when the outputted addresses contain any errors.

Referring again to FIG. 1, if error detector 32 generates all error signal on its output 56, this error signal triggers the operation of the error correction unit 34. In the preferred embodiment, the error correction unit 34 is implemented in assembly level instruction code which is stored within nonvolatile memory 13, but it should be noted that correction unit 34 may be implemented using other types of computer code and may be stored in other memories such as main memory 18. Correction unit 34 may also be implemented Using hardware components, although such an implementation would be rather complex and Costly. The specific implementation described herein has been chosen because it greatly reduces the complexity of the apparatus of the present invention.

Figure 5:
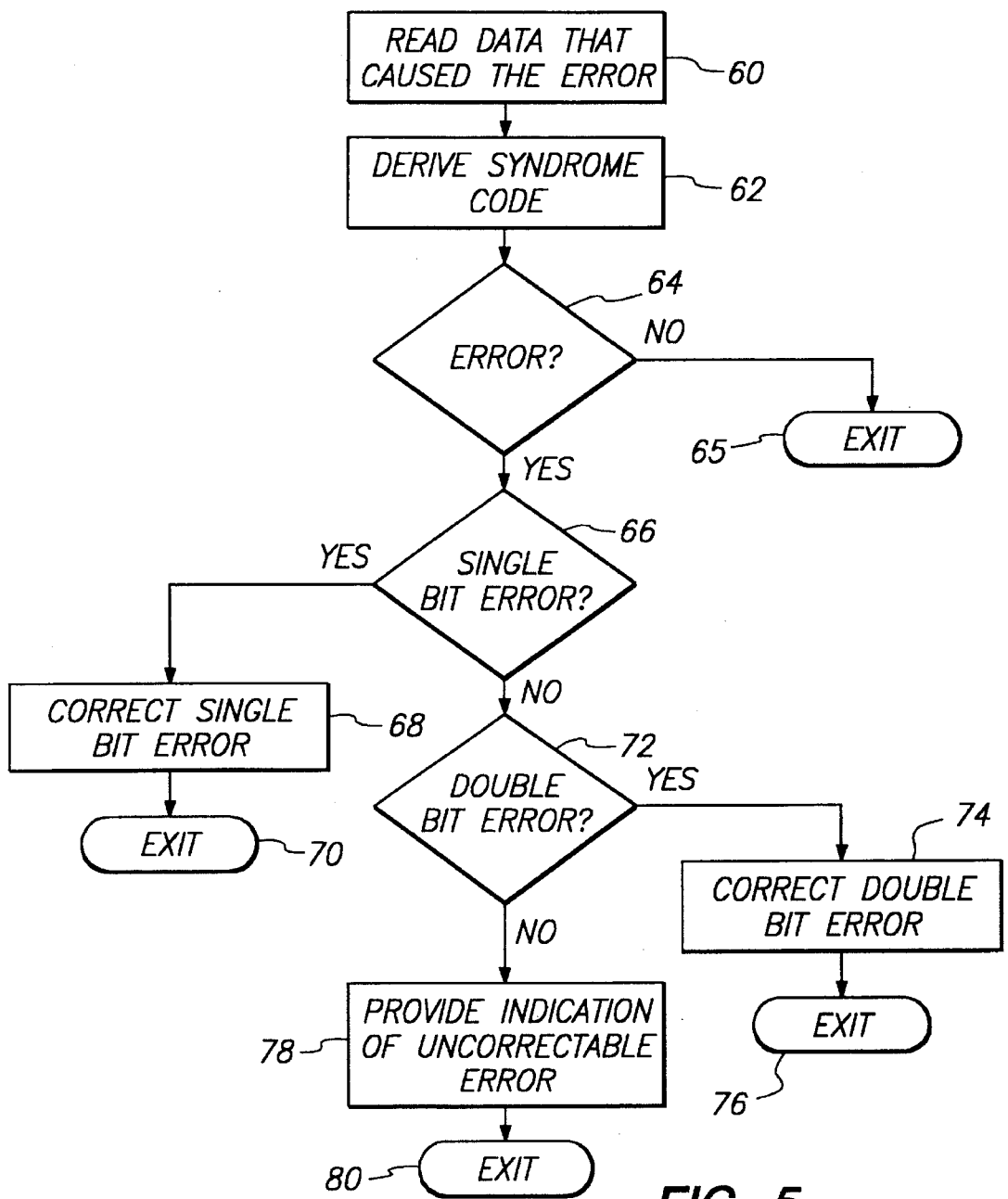
FIG. 5 is a general flow diagram for the error correction unit 34 of the present invention.

With reference to FIG. 5, there is provided an overall flow diagram for the correction unit 34. When correction unit 34 is executed by CPU 12, it causes CPU 12 to first read and receive 60 the entry in CPAT 26 which caused the correction unit 34 to be invoked. As noted above, this entry contains a first portion containing addresses (eighty-four bits in the present example), and a second portion containing the error code (fifteen bits in the present example). For the sake of simplicity, the CPAT entry will be referred to hereinafter as "data", with the addresses being referred to as the data portion and the error code being referred to as the error code portion. In accordance with this invention, the CPAT entry may be denoted as Data[X-1:0] where X is the number of bits in the entry (which, for the present example, is 99).

Once the data is received, the syndrome code for the data is derived 62. The syndrome code may be derived in one of two ways. First, CPU 12 may receive the syndrome code from the error detector 32, since the error detector 32 has already generates the syndrome code in checking the data for errors. Alternatively, CPU 12, under control of error correction unit 34, may generate the syndrome code. Either method may be used. Once the syndrome code is derived 62, CPU 12 checks 64 the syndrome code to verify that there is indeed an error in the data. Step 64 is preferably performed by determining whether the syndrome code has a non-zero value. If the code is zero, then it can be concluded that the data contains no errors, and that the error detector 32 generated a false alarm. In such a case, CPU 12 may exit 65 the error correction routine 34. However, if the syndrome code is non-zero, then it can be concluded that the data does contain an error. As a result, CPU 12 proceeds to step 66 to attempt to correct the error.

CPU 12 preferably begins the error correction process be first checking 66 for single-bit errors. If a single bit error is detected, then CPU 12 corrects 68 the single bit error and exits 70 the correction routine 34. On the other hand, if no single bit error is detected, then CPU 12 proceeds to step 72 to check for double bit errors. If a double bit error is detected, CPU 12 corrects 74 the double bit error, and thereafter exits 76 the correction routine 34. However, if no double bit error is detected, then it means that the data contains fin uncorrectable error. In such a case, CPU 12 provides 78 an indication (such as an error message or error signal) that an uncorrectable error has occurred. Thereafter, CPU 12 exits 80 the error correction routine 34.

The error correction unit 34 has thus far been described in general terms. To describe the correction unit 34 in greater detail, reference will now be made 16 FIGS. 6 and 7a–7c, which provide, respectively, a more detailed flow diagram for steps 66 and 68 of FIG. 5, and a more detailed flow diagram for steps 72 and 74 of FIG. 5.

Figure 6:
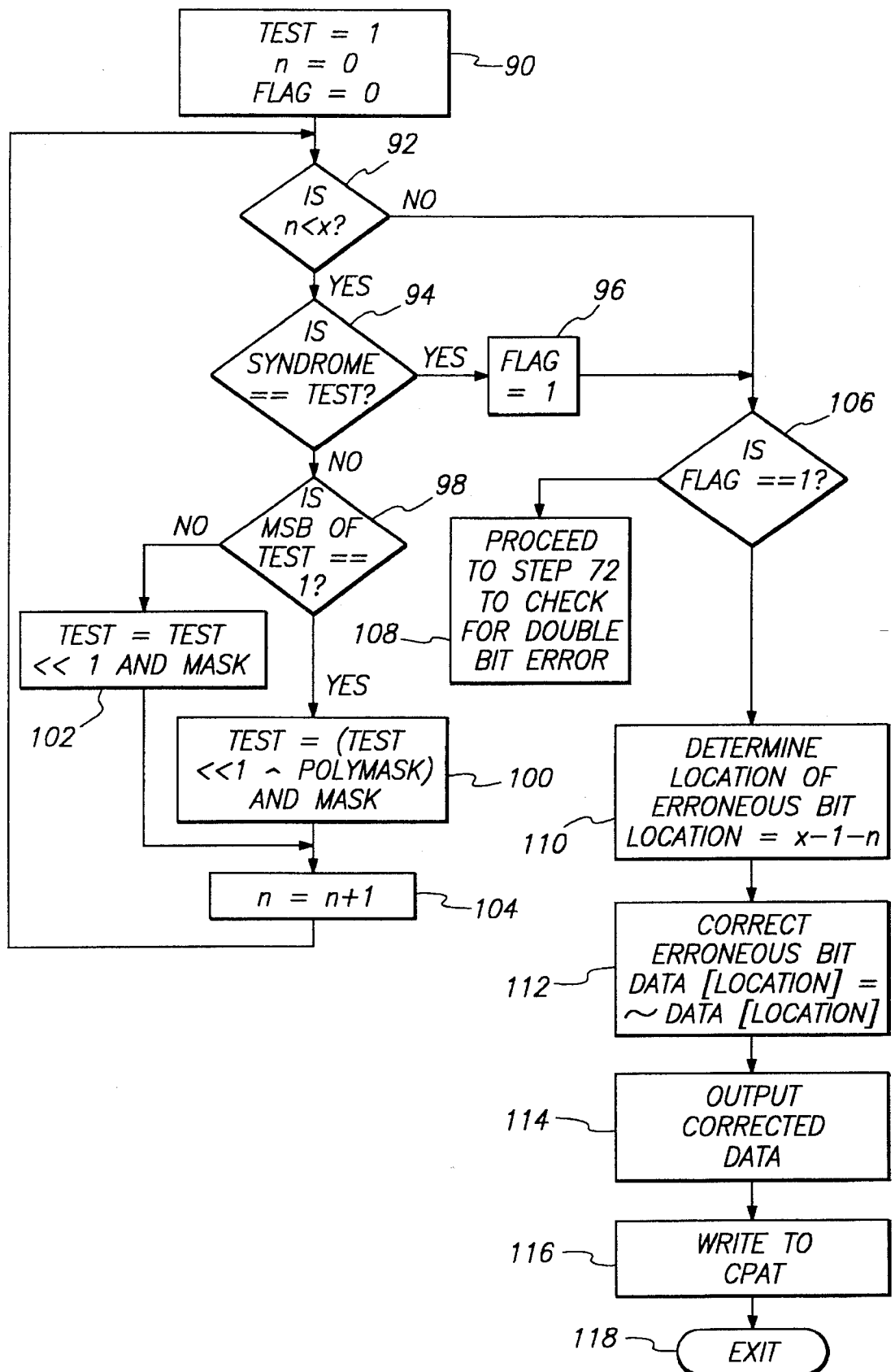
FIG. 6 is a detailed flow diagram for steps 66 and 68 shown in FIG. 5.

Referring first to FIG. 6, there is provided a detailed flow diagram for the single bit error detection/correction method of the present invention. This meth6d, carried out by CPU 12, preferably begins with the initialization 90 of selected parameter. First, a Test code is set to a value of 1. Preferably, this test code is a multiple bit variable also, a counter n is set to 0. In addition, a flag variable is set to 0. As will be described further Below, this flag indicates whether a correctable error has been detected. Once the above variables are set, CPU 12 proceeds to step 92 to determine whether the counter n is less than a value of X. Preferably, the value X is equal to the number of bits in the data, including the eft or code (99 bits in the present example). If n is not less than X, then it means that the loop comprising steps 92 through 104 has been executed a predetermined number of times and should not be executed further. In such a case, CPU 12 exits the loop and proceeds to step 106. Step 106 and the subsequent steps will be described in a later section.

On the other hand, if the counter n is less than X, then CPU 12 proceeds to step 94 to determine whether the syndrome code derived in step 62 (FIG. 5) is equal to the current value of the Test code. If so, then it means that a single bit correctable error has been found in the data, in which case, the CPU 12 sets the flag variable to 1 to indicate that a correctable error has been found, and proceeds to step 106.

If, however, the syndrome code is not equal to the value of the current test code, then CPU 12 proceeds to determine 98 whether the most significant bit (MSB) of the current Test code is a 1. If so, then CPU 12 proceeds to step 100 to shift each bit of the Test code one position to the left. Then CPU 12 performs an XOR operation on the shifted Test code and a polynomial masking value (polymask). This polymask is preferably derived from the same generating polynomial used to generate the error code contained in the data. In the present example, the generating polynomial is that shown on page 8, line 20 of this disclosure. The polymask value is preferably derived by: (1) removing the highest order component ($x^{15}$); (2) substituting the value 2 for the variable x; and (3) adding all of the components together. For the generating polynomial shown, the polymask value is 20269. Once the Test code has been shifted and XORed with the polymask, CPU 12 may optionally perform an AND operation with a selected masking value. This additional step simply serves to round off the field of the Test code, and may be skipped if so desired. Once CPU 12 has performed all of the functions shown in step 100, thereby deriving an updated Test code, it sets the current Test code to be equal to the updated Test code.

Returning to step 98, if CPU 12 determines that the MSB of the current Test code is not equal to 1, then CPU 12 branches to step 102 to perform the functions shown therein. Namely, CPU 12 shifts each bit in the Test code one position to the left, and then (optionally) AND's the shifted Test code with a selected masking value to derive an updated Test code. Once that is done, CPU 12 sets the current Test code to be equal to the updated test code.

Regardless of whether step 100 or 102 is performed, the next step implemented by CPU 12 is to increment 104 the counter n by 1. Once that is done, CPU 12 loops back to step 92 to repeat the steps described above. This process continues until steps 92–104 have been executed a selected number of times, or until a correctable single bit is found.

Regardless of how loop 92–104 is exited, step 106 is performed upon exit from the loop. In step 106, CPU 12 determines whether the flag variable has been set to a 1. If the flag has not been set to a 1, then it means that a single bit correctable error was not found. In such an instance, CPU 12 proceeds 108 to step 72 (FIG. 5) to check for double bit correctable errors. However, if the flag variable is set to 1, thereby indicating that a single bit correctable error was found, then CPU 12 proceeds to determine 110 the location of the erroneous bit in the data. This determination is preferably made by using the current value of the counter n. Upon exit from loop 92–104, the counter n will contain a current value. To determine the location in the data of the erroneous bit, the value n of the counter, along with the value 1, are subtracted from X, the number of bits in the data. Once the location of the erroneous bit is ascertained, CPU 12 corrects 112 the erroneous bit, preferably by setting it equal to its complement. Once that is done, a set of corrected data is derived, representing what the data should have been had there been no error in the CPAT 26. CPU 12 preferably outputs i 14 this set of corrected data to the CPAT 26, and writes 116 it into the proper entry of the CPAT 26 to replace the old erroneous set of data currently stored therein. Once that is done, CPU 12 proceeds 118 to step 70 (FIG. 5) to exit the error correction unit 34. The error has been found and corrected.

Figure 7A:
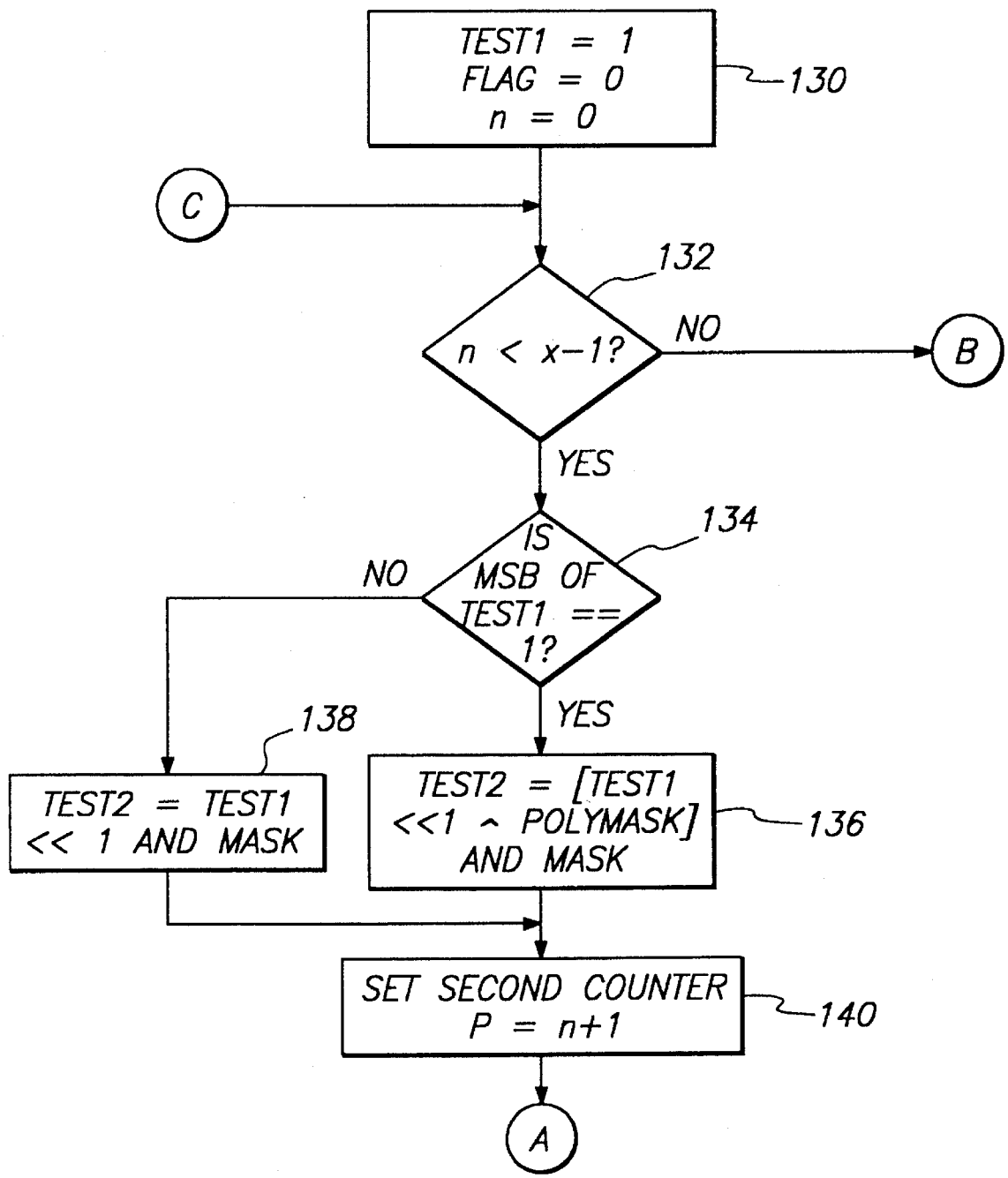
FIGS. 7a–7c depict a detailed flow diagram for steps 72 and 74 of FIG. 5.
Figure 7B:
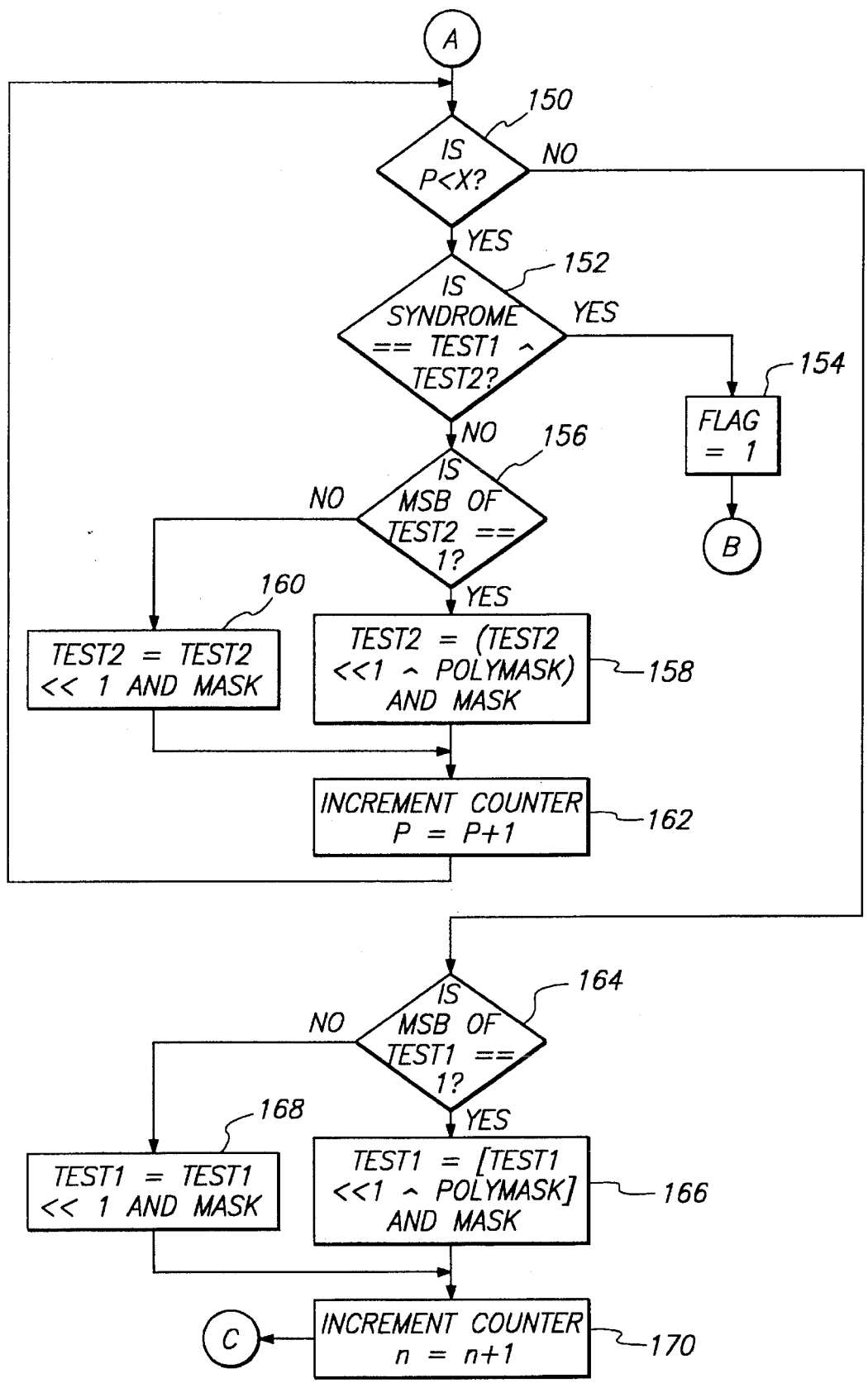
Figure 7C:
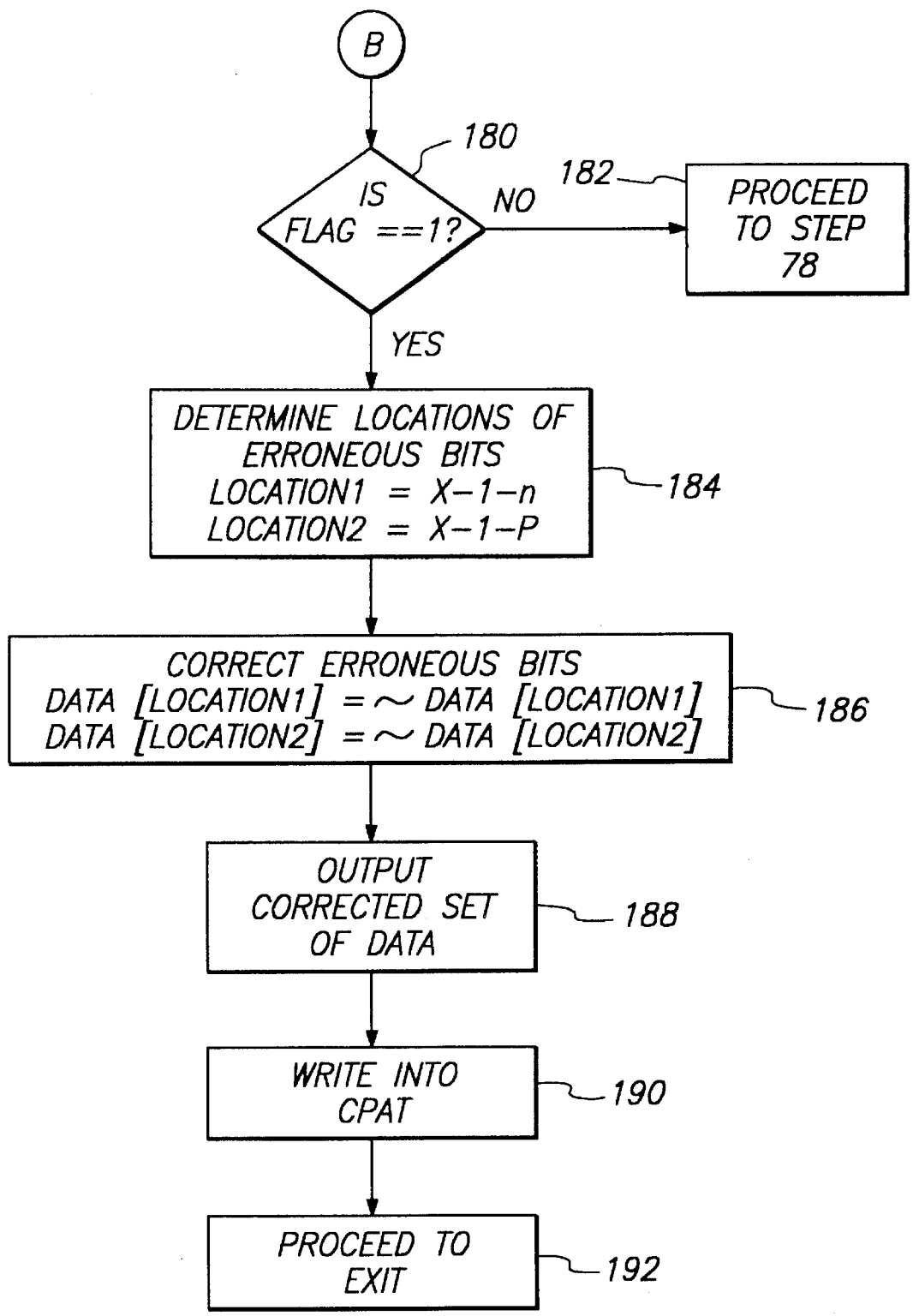

Suppose now that the data contains more than one erroneous bit. In such a case, CPU 12 will carry out the steps shown in FIGS. 7a–7c to attempt to locate and to correct a double bit error. CPU 12 begins the process by initializing 130 selected variables. More specifically, CPU 12 sets a first multiple bit test code (Test1) to a value of 1, sets a first counter n to 0, and sets the flag variable to 0. Thereafter, CPU 12 enters a first loop by determining 132 whether the current value of the first counter n is less than X− 1, where X again is the number of bits in the data. If n is not less than X−1, then it means that step 132 has already been executed a predetermined number of time:s, in which case, CPU 12 exits the loop and proceeds to step 180 of FIG. 7c. FIG. 7c will be described in greater detail in a later section.

On the other hand, if n is less than X–1. then CPU 12 goes on to step 134 to determine whether the MSB of the first test code, Test1, is a 1. If so, CPU 12 branches to step 136. If not, CPU 12 branches to step 138. In step 136, CPU 12 performs three major functions. First, CPU 12 shifts each of the bits in the first test code, Test1, one position to the left. Second, CPU 12 XOR's the shifted first test code with the polymask value described above to derive an updated test code. Optionally, CPU 12 may further perform an AND operation with a masking value to round off the test code. Third, CPU 12 sets a second test code, Test2, to be equal to the updated test code derived as a result of the first two functions just described. Step 136 serves to update the value of the second test code, Test2.

Step 138 likewise updates the value of the second test code, Test2. However, CPU 12 performs no XOR operation in step 138. Rather, CPU 12 just shifts each of the bits in the first test code, Test1, one position to the left. Optionally, CPU 12 may further perform an AND operation with a masking value to round off the test code. Once that is done, CPU 12 sets the second test code, Test2, to be equal to the shifted test code.

Regardless of which step (136 or 138) is performed, the CPU 12 proceeds to step 140 to set a second counter p to a value equal to the current value of the first counter n plus 1. Once the second counter p is set in step 140, CPU 12 proceeds to step 150 (FIG. 7b) to enter a second and nested loop. In this second loop, CPU 12 begins by determining 150 whether the current value of the second counter p is less than X (i.e. the number of bits in the data). If not, then it means that the second loop, has already been performed a predetermined number of times. If such is the case, then CPU 12 exits the loop to proceed to step 164. However, if p is less than X, then CPU 12 goes on to step 152 to determine whether the syndrome code derived in step 62 (FIG. 5) is equal to the result of the first test code, Test1, XORed with the second test code, Test2. If the syndrome code is equal to Test1 XORed with Test2, then it means that a double bit correctable en or has been found in the data. In such an instance, CPU 12 sets 154 the value of the flag variable to 1 to indicate that a double bit correctable error has been found, and proceeds to step 180 of FIG. 7c.

On the other hand, if the answer to step 152 is negative, then CPU 12 goes on to step 156 to determine whether the MSB of the second test code, Test2, is a 1. if so, then CPU 12 performs step 158. If not, then CPU 12 performs step 160. In step 158, CPU 12 performs three major functions. First, CPU 12 shifts each of the bits in the second test code, Test2, one position to the left. Second, CPU 12 XOR's the shifted second test code with the polymask value described above to derive an updated test code. Optionally, CPU 12 may further perform an AND operation with a masking value to round off the test code. Third, CPU 12 sets the second test code, Test2, to be equal to the updated test code just derived. Step 158 serves to update the value of the second test code, Test2.

Step 160, like step 158, also updates the value of the second test code, Test2. However, in step 160, CPU 12 performs no XOR operation. Instead, CPU 12 just shifts each of the bits in the second test code, Test2, one position to the left. Optionally, CPU 12 may further perform an AND operation with a masking value to round off the test code. Once that is done, CPU 12 sets the second test code, Test2, to be equal to the shifted test code.

Regardless of whether step 158 or 160 is performed, CPU 12 thereafter increments 162 the second counter p by 1. Then, CPU 12 loops back to step 150 to repeat the process just described. CPU 12 preferably repeats loop 150–162 until the loop has been performed a predetermined number of times, or until it is determined that the syndrome code is equal to the first test code XORed with the second test code (step 152).

If CPU 12 exits the loop 150–162 as a result of step 150, then CPU 12 proceeds to step 164 to determine whether the MSB of the first test code, Test1, is a 1. If so, then CPU 12 carries out step 166. If not, then CPU 12 performs steps 168. In step 166, CPU 12 performs three major functions. First, CPU 12 shifts each of the bits in the first test code, Test1, one position to the left. Second, CPU 12 XOR's the shifted first test code with the polymask value described above to derive an updated test code. Optionally, CPU 12 may further perform an AND operation with a masking value to round off the test code. Third, CPU 12 sets the first test code, Test1, to be equal to the updated test code derived as a result of the first two functions just described. Step 166 serves to update the value of the first test code, Test1.

Step 168 likewise updates the value of the first test code, Test1. However, CPU 12 performs no XOR operation in step 168. Rather, CPU 12 just shifts each of the bits in the first test code, Test1, one position to the left. Optionally, CPU 12 may further perform an AND operation with a masking value to round off the test code. Once that is done, CPU 12 sets the first test code, Test1, to be equal to the shifted test code.

Regardless of whether step 166 or 168 is performed, CPU 12 thereafter increments 170 the first counter n by 1. After that, CPU 12 loops back to step 132 of FIG. 7a to repeat the first loop. Preferably, CPU 12 repeats the first loop until the loop has been performed a predetermined number of times, or until it is determined that the syndrome code is equal to the first test code, Test1, XORed with the second test code, Test2.

Upon exit from the first and second loops, CPU 12 proceeds to step 180 of FIG. 7c. In step 180, CPU 12 determines whether the flag variable has been get to 1. If not, then it means that a double bit correctable error was not found. In such a case, CPU 12 proceeds 182 to step 78 of FIG. 5 to provide an indication that the error in the data cannot be corrected. On the other hand, if the flag, variable has been set to a 1, thereby indicating that a double bit correctable error has been found, CPU 12 proceeds to step 184 to determine the locations of the erroneous bits. When CPU 12 exits the first and second loops, the first and second counters n and p will contain current values. These current values are used to determine the locations of the erroneous bits. More specifically, a first location (location1) is derived by subtracting the current value of the first counter n, along with a 1, from the value X. A second location (location2) is ascertained by subtracting the current value of the second counter p, along with a 1, from the value X. The locations of the erroneous bits in the data are thus determined.

Once the locations of the erroneous bits are known, CPU 12 corrects 186 the erroneous bits, preferably by setting them equal to their complements, as shown in step 186 of FIG. 7c. Once the erroneous bits are corrected, a set of corrected data is derived, representing what the data would have been had there been no en or in the CPAT 26. CPU 12 outputs 188 this set of corrected data to the CPAT 26, and writes 190 it into the proper entry of the CPAT to replace the corrupted entry currently contained therein. The erroneous data is thus detected and corrected. Thereafter, CPU 12 exits 192 the error correction unit 34 to return to normal operation.

As an additional disclosure, a set of source code for the error detection unit 34 is provided in FIGS. 8a–8b. The source code is written in C language for use, for example, in a system having a SPARC V9 microprocessor as the CPU. To prevent confusion, note that in the source code: (1) the syndrome code is assigned the variable "check"; (2) the first test code is assigned the variable "syndrome"; and (3) the second test code is assigned the variable "syndrome 1".

What is claimed is:

1. For a set of data having a first portion representing data and a second portion representing an error code, a computer-implemented method for correcting an error in said set of data, comprising the steps of:

(a) generating a syndrome code based on the first and second portions of the set of data;

(b) setting a multiple-bit test code to a value of 1;

(c) determining whether said syndrome code is equivalent to said test code;

(d) in response to a determination that said syndrome code is equivalent to said test code:

i. determining a location in the set of data at which an erroneous bit is located;

ii. complementing said erroneous bit at said location to correct the error in the set of data; and iii. outputting a corrected set of data representing the set of data with said erroneous bit corrected;

(e) in response to a determination that said syndrome code is not equivalent to said test code, determining whether the most significant bit of said test code is a 1;

(f) in response to a determination that the most significant bit of said test code is a 1:
  i. shifting each bit in said test code one position to the left to derive a shifted test code;
  ii. XORing said shifted test code with a polynomial masking value to derive an updated test code; and
  iii. setting said test code to be equivalent to said updated test code;

(g) in response to a determination that the most significant bit of said test code is not a 1:
  i. shifting each bit in said test code one position to the left to derive a shifted test code; and
  ii. setting said test code to be equivalent to said shifted test code;

(h) repeating steps (c) through (g) a selected number of times or until said syndrome code is determined to be equivalent to said test code.

2. The method of claim 1, wherein the second portion of the set of data is generated using a generating polynomial, and wherein said polynomial masking value is derived from said generating polynomial.

3. For a set of data having a first portion representing data and a second portion representing an error code, a computer-implemented method for correcting an error in said set of data, comprising the steps of:

(a) receiving a syndrome code generated based upon the first and second portions of the set of data;

(b) setting a multiple-bit test code to a value of 1;

(c) determining whether said syndrome code is equivalent to said test code;

(d) in response to a determination that said syndrome code is equivalent to said test code:
  i. determining a location in the set of data at which an erroneous bit is located:
  ii. complementing said erroneous bit at said location to correct the error in the set of data; and
  iii. outputting a corrected set of data representing the set of data with said erroneous bit corrected;

(e) in response to a determination that said syndrome code is not equivalent to said test code, determining whether the most significant bit of said test code is a 1;

(f) in response to a determination that the most significant bit of said test code is a 1:
  i. shifting each bit in said test code one position to the left to derive a shifted test code;
  ii. XORing said shifted test code with a polynomial masking value to derive an updated test code; and
  iii. setting said test code to be equivalent to said updated test code;

(g) in response to a determination that the most significant bit of said test code is not a 1:
  i. shifting each bit in said test code one position to the left to derive a shifted test code; and
  ii. setting said test code to be equivalent to said shifted test code;

(h) repeating steps (c) through (g) a selected number of times or until said syndrome code is determined to be equivalent to said test code.

4. The method of claim 3, wherein the second portion of the set of data is generated using a generating polynomial, and wherein said polynomial masking value is derived from said generating polynomial.

5. For a set of data having a first portion representing data and a second portion representing an error code, a computer-implemented method for correcting a double-bit error in said set of data, comprising the steps of:

(a) generating a syndrome code based on the first and second portions of the set of data;

(b) setting a first counter to a value of 0;

(c) setting a first multiple-bit test code to a value of 1;

(d) determining whether the most significant bit of said first test code is a 1;

(e) in response to a determination that the most significant bit of said first test code is a 1:
  i. shifting each bit in said first test code one position to the left to derive a shifted first test code;
  ii. XORing said shifted first test code with a polynomial masking value to derive an update first test code; and
  iii. setting a second test code to be equivalent to said updated first test code;

(f) in response to a determination that the most significant bit of said first test code is not a 1:
  i. shifting each bit in said first test code one position to the left to derive a shifted first test code; and
  ii. setting said second test code to be equivalent to said shifted first test code;

(g) setting a second counter equal to the value of said first counter plus one;

(h) determining whether said syndrome code is equivalent to said first test code XORed with said second test code;

(i) in response to a determination that said syndrome code is equivalent to said first test code XORed with said second test code:
  i. determining two locations in the set of data where erroneous bits are located;
  ii. complementing said erroneous bits at said locations to correct the errors in the set of data; and
  iii. outputting a corrected set of data representing the set of data with said erroneous bits corrected;

(j) in response to a determination that said syndrome code is not equivalent to said first test code XORed with said second test code, determining whether the most significant bit of said second test code is a 1;

(k) in response to a determination that the most significant bit of said second test code is a 1:
  i. shifting each bit in said second test code one position to the left to derive a shifted second test code;
  ii. XORing said shifted second test code with said polynomial masking value to derive an updated second test code; and
  iii. setting said second test code to be equivalent to said updated second test code;

(l) in response to a determination that the most significant bit of said second test code is not a 1:
  i. shifting each bit in said second test code one position to the left to derive a shifted second test code; and
  ii. setting said second test code to be equivalent to said shifted second test code;

(m) incrementing said second counter;

(n) repeating steps (h) through (m) until said second counter reaches a predetermined value or until it is determined that said syndrome code is equivalent to said first test code XORed with said second test code;

(o) determining whether the most significant bit of said first test code is a 1;

(p) in response to a determination that the most significant bit of said first test code is a 1:
  i. shifting each bit in said first test code one position to the left to derive a shifted first test code;
  ii. XORing said shifted first test code with said polynomial masking value to derive an updated first test code; and iii. setting said first test code to be equivalent to said updated first test code;

(q) in response to a determination that the most significant bit of said first test code is not a 1:
  i. shifting each bit in said first test code one position to the left to derive a shifted first test code; and
  ii. setting said first test code to be equivalent to said shifted first test code;

(r) incrementing said first counter; and (s) repeating steps (d) through (r) until said first counter reaches a second predetermined value or until it is determined that said syndrome code is equivalent to said first test code XORed with said second test code.

6. The method of claim 5, wherein the second portion of the set of data is generated using a generating polynomial, and wherein said polynomial masking value is derived from said generating polynomial.

7. For a set of data having a first portion representing data and a second portion representing an error code, a computer-implemented method for correcting a double-bit error in said set of data, comprising the steps of:

(a) receiving a syndrome code generated based upon the first and second portions of the set of data;

(b) setting a first counter to a value of 0;

(c) setting a first multiple-bit test code to a value of 1;

(d) determining whether the most significant bit of said first test code is a 1;

(e) in response to a determination that the most significant bit of said first test code is a 1:
  i. shifting each bit in said first test code one position to the left to derive a shifted first test code;
  ii. XORing said shifted first test code with a polynomial masking value to derive an update first test code; and
  iii. setting a second test code to be equivalent to said updated first test code;

(f) in response to a determination that the most significant bit of said first test code is not a 1:
  i. shifting each bit in said first test code one position to the left to derive a shifted first test code; and
  ii. setting said second test code to be equivalent to said shifted first test code;

(g) setting a second counter equal to the value of said first counter plus one;

(h) determining whether said syndrome code is equivalent to said first test code XORed with said second test code;

(i) in response to a determination that said syndrome code is equivalent to said first test code XORed with said second test code:
  i. determining two locations in the set of data where erroneous bits are located;
  ii. complementing said erroneous bits at said locations to correct the errors in the set of data; and
  iii. outputting a corrected set of data representing the set of data with said erroneous bits corrected;

(j) in response to a determination that said syndrome code is not equivalent to said first test code XORed with said second test code, determining whether the most significant bit of said second test code is a 1;

(k) in response to a determination that the most significant bit of said second test code is a 1:
  i. shifting each bit in said second test code one position to the left to derive a shifted second test code;
  ii. XORing said shifted second test code with said polynomial masking value to derive an updated second test code; and
  iii. setting said second test code to be equivalent to said updated second test code;

(l) in response to a determination that the most significant bit of said second test code is not a 1:
  i. shifting each bit in said second test code one position to the left to derive a shifted second test code; and
  ii. setting said second test code to be equivalent to said shifted second test code;

(m) incrementing said second counter;

(n) repeating steps (h) through (m) until said second counter reaches a predetermined value or until it is determined that said syndrome code is equivalent to said first test code XORed with said second test code;

(o) determining whether the most significant bit of said first test code is a 1;

(p) in response to a determination that the most significant bit of said first test code is a 1:
  i. shifting each bit in said first test code one position to the left to derive a shifted first test code;
  ii. XORing said shifted first test code with said polynomial masking value to derive an updated first test code; and
  iii. setting said first test code to be equivalent to said updated first test code;

(q) in response to a determination that the most significant bit of said first test code is not a 1:
  i. shifting each bit in said first test code one position to the left to derive a shifted first test code; and
  ii. setting said first test code to be equivalent to said shifted first test code;

(r) incrementing said first counter; and (s) repeating steps (d) through (r) until said first counter reaches a second predetermined value or until it is determined that said syndrome code is equivalent to said first test code XORed with said second test code.

8. The method of claim 7, wherein the second portion of the set of data is generated using a generating polynomial, and wherein said polynomial masking value is derived from said generating polynomial.

* * * * *